US009846613B2

(12) United States Patent
Arslan et al.

(10) Patent No.: US 9,846,613 B2
(45) Date of Patent: Dec. 19, 2017

(54) EFFICIENT HIGH/LOW ENERGY ZONE SOLID STATE DEVICE DATA STORAGE

(71) Applicant: Quantum Corporation, San Jose, CA (US)

(72) Inventors: Suayb Arslan, Irvine, CA (US); Turguy Goker, Vista, CA (US)

(73) Assignee: Quantum Corporation, San Jose, CA (US)

(*) Notice: Subject to any disclaimer, the term of this patent is extended or adjusted under 35 U.S.C. 154(b) by 0 days.

(21) Appl. No.: 15/006,403

(22) Filed: Jan. 26, 2016

(65) Prior Publication Data

US 2016/0217031 A1    Jul. 28, 2016

Related U.S. Application Data

(60) Provisional application No. 62/108,190, filed on Jan. 27, 2015.

(51) Int. Cl.
| | |
|---|---|
| *G06F 11/10* | (2006.01) |
| *G06F 3/06* | (2006.01) |
| *H03M 13/35* | (2006.01) |
| *G06F 1/26* | (2006.01) |
| *G06F 1/32* | (2006.01) |
| *G11B 20/12* | (2006.01) |
| *G11B 20/18* | (2006.01) |
| *H03M 13/37* | (2006.01) |

(Continued)

(52) U.S. Cl.
CPC .......... *G06F 11/1008* (2013.01); *G06F 1/266* (2013.01); *G06F 1/3268* (2013.01); *G06F 3/0619* (2013.01); *G06F 3/0625* (2013.01); *G06F 3/0653* (2013.01); *G06F 3/0679* (2013.01); *G11B 20/1217* (2013.01); *G11B 20/1833* (2013.01); *H03M 13/353* (2013.01); *H03M 13/373* (2013.01); *H03M 13/611* (2013.01); *H03M 13/13* (2013.01); *H03M 13/6381* (2013.01); *H03M 13/6393* (2013.01); *H03M 13/6513* (2013.01)

(58) Field of Classification Search
CPC .................................................... G06F 11/1008
USPC .......................... 714/766, 721, 801, 764, 736
See application file for complete search history.

(56) References Cited

U.S. PATENT DOCUMENTS

| | | | | |
|---|---|---|---|---|
| 4,605,607 A | * | 8/1986 | Nikles | ..................... G11B 7/245 430/17 |
| 8,028,137 B2 | * | 9/2011 | Wach | .................. G06F 11/2084 711/161 |

(Continued)

*Primary Examiner* — Fritz Alphonse
(74) *Attorney, Agent, or Firm* — Eschweiler & Potashnik, LLC

(57) ABSTRACT

Methods and apparatus associated with storing data in high or low energy zones are described. Example apparatus include a data storage system (DSS) that protects a message using an erasure code (EC). A location in the DSS may have an energy efficiency rating or a latency. Example apparatus include circuits that produce EC encoded data that has a likelihood of use, that select a location to store the EC encoded data in the DSS based on the energy efficiency rating, the latency, or the likelihood of use, that store the EC encoded data in the location, and that compute an order of retrieval for EC encoded data stored in the location. The order of retrieval may be based on the energy efficiency rating or the latency. The EC encoded data may also have a priority based on the number of erasures for which the EC corrects.

25 Claims, 7 Drawing Sheets

(51) Int. Cl.
*H03M 13/00* (2006.01)
*H03M 13/13* (2006.01)

(56) References Cited

U.S. PATENT DOCUMENTS

| | | | | |
|---|---|---|---|---|
| 2011/0047411 A1* | 2/2011 | Gille | ................... | G06F 11/073 714/723 |
| 2012/0173925 A1* | 7/2012 | Lahdensivu | ........ | G06F 11/1008 714/15 |
| 2014/0344617 A1* | 11/2014 | Resch | ................. | G06F 11/1088 714/6.31 |

* cited by examiner

US 9,846,613 B2

EFFICIENT HIGH/LOW ENERGY ZONE SOLID STATE DEVICE DATA STORAGE

CROSS REFERENCE TO RELATED APPLICATIONS

This application claims the benefit of U.S. Provisional Application 62/108,190, filed Jan. 27, 2015.

BACKGROUND

Solid state storage devices are increasingly used for storing and accessing an increasing amount of electronic data. The number and type of solid state devices used to store and access data also continues to expand. As miniaturization and advancing technology increase the sophistication, reliability, and capacity of solid state storage devices, including solid state drives (SSD) and different types of random access memory (RAM), improved efficiencies are constantly sought for these devices. Improved efficiencies are needed because users who store data have limited resources. Limited resources may include electricity, cooling capacity, time, or physical storage space associated with read only memory (ROM) devices and RAM. ROM devices include solid state drives and other devices including programmable ROM (PROM) devices and erasable programmable ROM (EPROM) devices. SSDs and other ROM-based devices may also include devices using persistent, resistance-based, non-volatile cross point structure memory, including 3D Xpoint memory. While SSDs and other ROM-based devices are rewritable, their rewrite capability may be limited or slow compared to conventional RAM. In particular, electricity is limited and may be costly. Additionally, as more and more solid state storage devices store and access more and more data, the power and resources required to operate those devices, and to maintain the facilities in which those devices are stored, continues to increase.

Data may be protected against storage media failure, transmission failure, or other loss by storing extra copies, by storing additional redundant information, or in other ways. Erasure coding is one type of redundancy based protection. Erasure coding uses additional redundant data to produce erasure codes that protect against 'erasures'. An erasure code (EC) allows data portions that are lost to be reconstructed from the surviving data. The application of erasure codes to data storage may typically have been for the purpose of recovering data in the face of failures of hardware elements storing the data. In some erasure codes, data may be more easily available, or systematic. In other erasure codes, data may not be directly accessible, (e.g. non-systematic) and may be less easily accessible and require more computation for recovery. The computational complexity may be a function of the approach used to compute parity data. For example, Reed-Solomon (RS) codes that compute parity data based on Galois Field arithmetic may have a higher computational cost than other approaches, including logical binary operations or approaches that are based on simple XOR operations. Similarly, it may be simpler to recover data using some types of erasure codes in which data may already be available at the time of an access request (e.g. systematic data) and it may be more complex to recover data using other types of erasure codes (e.g. non-systematic data which requires decoding). However, conventional systems may compute erasure codes without considering the complexity of encoding the data. Conventional systems may also store erasure codes without considering the complexity of recovering the data. Conventional systems may further store erasure codes without considering the energy efficiency of the storage device in which the erasure codes are stored. Thus, in conventional systems, the efficiency of encoding or recovering data based on the type of erasure code is not optimal. For example, conventional systems that store data and parity data on SSDs or in RAM do not consider properties of the parity data being written or the different energy requirements for reading or writing data at different zones on an SSD or in RAM.

Adding redundancy introduces overhead that consumes more storage capacity or transmission bandwidth, which in turn adds cost and may increase energy consumption. The overhead added by erasure code processing tends to increase as the protection level increases. Ideally, the redundant information may never need to be accessed, and thus conventional systems may group all redundancy data together and store it in some out of the way place. This one-size-fits-all approach may produce sub-optimal results, particularly concerning energy conservation.

BRIEF DESCRIPTION OF THE DRAWINGS

The accompanying drawings, which are incorporated in and constitute a part of the specification, illustrate various example apparatus, methods, and other example embodiments of various aspects of the invention. It will be appreciated that the illustrated element boundaries (e.g., boxes, groups of boxes, or other shapes) in the figures represent one example of the boundaries. One of ordinary skill in the art will appreciate that in some examples one element may be designed as multiple elements or that multiple elements may be designed as one element. In some examples, an element shown as an internal component of another element may be implemented as an external component and vice versa. Furthermore, elements may not be drawn to scale.

DETAILED DESCRIPTION

Figure 1:
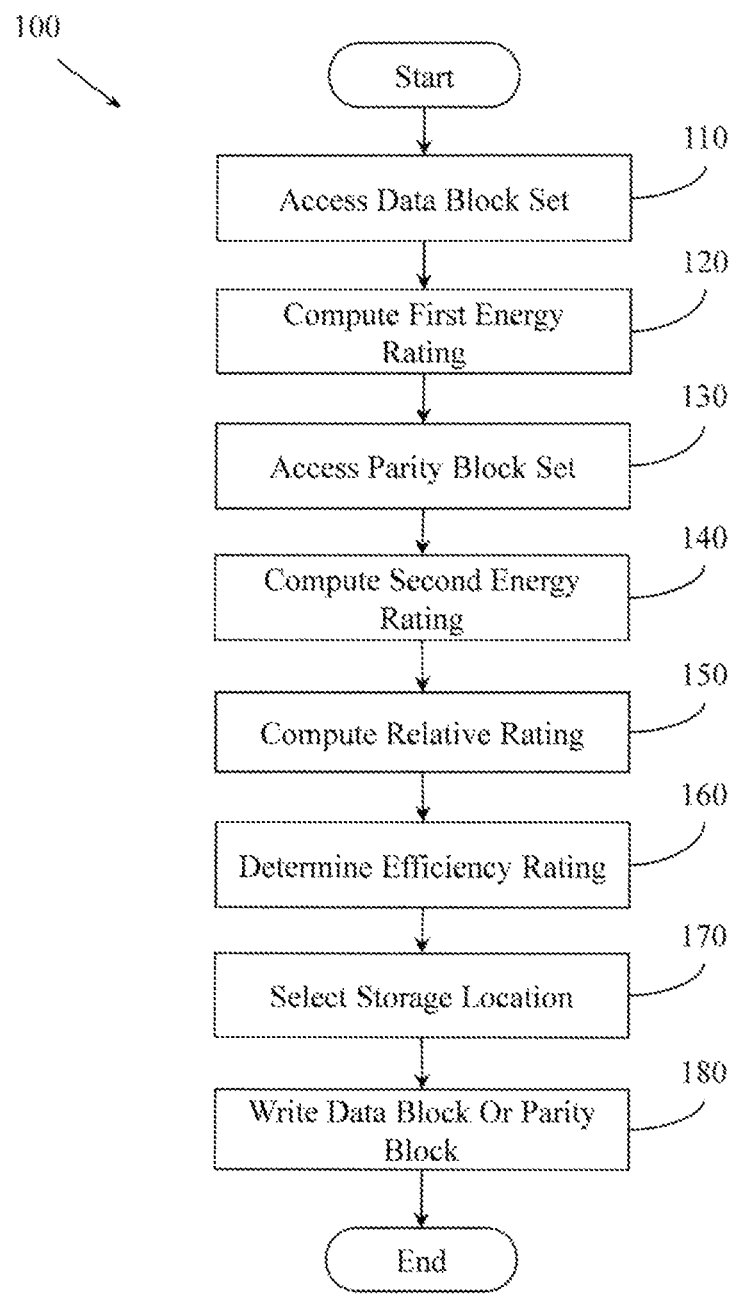
FIG. 1 illustrates an example method for storing electronic data in an energy efficient manner.

Example apparatus and methods control where erasure codes are stored based, at least in part, on the likelihood that the data will be needed. Data that is most likely to be needed is stored in a more energy efficient way or more energy efficient location because it might actually be used and thus the energy needed to use it might actually be consumed. Data that is less likely to be needed is stored in a less energy efficient manner because it might never be used and thus the energy to use it might never be expended. Data may thus be described as having an access profile. The access profile may be time-dependent. The access profile may change, based on an erasure code approached used to protect the data. Thus, example methods and apparatus improve the energy efficiency of data storage systems by storing electronic data in high or low energy efficiency zones in a solid state storage device according to a property of the data or a property of the storage device. This problem did not exist before the advent of electronic data storage systems. Increasing the energy efficiency of an SSD or a computer memory cannot be performed in the human mind because the human mind cannot control the transmission or expenditure of electricity in an electronic device. Similarly, reducing the amount of electricity used by an SSD or a computer memory cannot be performed using paper and pencil because neither paper nor pencil can control the transmission or usage of electricity in an SSD or a computer memory. For example, neither the human mind nor pencil and paper can control the power used by an SSD as it reads from one zone or another zone to find parity data.

Example methods and apparatus improve on conventional approaches by considering data and parity data placement in memory cells based, at least in part, on a diversity of bit error rates among different memory units. Bit error rates may differ among different memory units or cells because of different channel types, which may be induced by programming techniques used when storing data or parity data. By using additional or different coding strategies, example methods and apparatus may rewrite bit cells more than once without incurring costly block erase cycles. Example methods and apparatus may employ write-once memory (WOM) codes when selecting additional or different coding strategies. In conventional systems, even slight changes in data eventually require the cells that store parity data to reprogram and consume more power. Example methods and apparatus analyze and model different energy zones within an SSD and consider the different energy zones when allocating data or parity data to a zone, thus improving energy consumption compared to conventional approaches.

Example methods and apparatus may access memory partitioned by power-efficiency zones. Memory, including RAM and SSDs, may be organized in a hierarchy based on capacity, cost, latency, reliability, or power efficiency. For example, static RAM (SRAM) and dynamic RAM (DRAM) may be employed in a data storage device (DSD) or in a computer. SRAM or DRAM may be manufactured using different techniques or materials. For example, SRAM may be manufactured using bipolar junction transistors (BJT) or metal-oxide-semiconductor field-effect transistors (MOS). BJT transistors may consume more power compared to MOS transistors of similar capabilities. In another example, the size of capacitors, transistors or wires used to construct RAM or an SSD may be different. For example, for a given area of silicon, memory capacity may be reduced by using fewer transistors, while power consumption is also reduced because of the smaller number of transistors. Thus, SRAM may trade capacity, power consumption, or affordability for speed, where low power SRAM (SRAM LP) has less capacity and consumes less power than high power SRAM (SRAM HP), but where the SRAM LP is also slower than SRAM HP or DRAM. Similarly, a Flash SSD may consume less power than a DRAM SSD, but Flash SSD may also be slower than a DRAM SSD. In another example, persistent, resistance-based cross point structure memory, including 3D Xpoint memory, may be faster and consume less power than tape, hard disk, SSDs, and DRAM, while being slower than local DRAM caches. Persistent, resistance-based, non-volatile cross point structure memory may include bit-level accessible memory.

Memory may also be organized in a hierarchy based on energy efficiency, performance, or power consumption properties associated with different levels of caches. For example, computers often employ level 1 (L1), level 2 (L2), and level 3 (L3) caches. L1 caches are typically the smallest sized caches, but are also the fastest of the three types of cache. An L1 cache typically consumes less area and less power compared to L2 or L3 caches. Similarly, an L2 cache is typically faster, smaller in area, and consumes less power than the L3 cache. In contrast, DRAM consumes a relatively larger amount of power due to the volatile architecture and high frequency refreshing cycles of DRAM. DRAM also consumes relatively more power due to the larger size and greater capability for storing larger amounts of data than conventional caches. SRAM may at infrequent times consume similar amounts of power as DRAM, but these are rare occurrences that happen during very high frequency operations, and may only occur during a small fraction of operation time, as a controller or CPU architecture may be adaptive and adjust the operation frequency on the fly.

Thus, different types of RAM in a DSD or computer memory can result in different power consumption in different zones of a DSD or computer. Similarly, different manufacturing processes or materials used in the construction of an individual type of RAM may result in different power consumptions within that particular individual RAM. Furthermore, different applications can also result in variations in power consumption zones. Different required delivery, latency, and availability guarantees can also produce variations in power consumption zones. Example methods and apparatus improve on conventional approaches to SSD design or memory usage by storing data and ECs (e.g. parity data) to different energy zones within an SSD or RAM based, at least in part, on a property of the SSD or RAM, or a property of the data or parity data to be stored.

To enhance data protection, different approaches for storing redundant copies of data have been employed. Erasure codes are one such approach. An erasure code is a forward error correction (FEC) code for the binary erasure channel. The FEC facilitates transforming a message of k symbols into a longer message of n symbols so that the original message can be recovered from a subset of the n symbols, k and n being integers, where n>k. The symbols may be individual items, including characters or bytes, or groups of items. The original message may be, for example, a file. An erasure code optimized for overhead or storage efficiency has the property that any k out of the n code word symbols are sufficient to recover the original message. Erasure codes may be more or less efficient or optimal with respect to other conditions, including transfer bandwidth or repair complexity.

Fountain codes are one type of EC. Fountain codes have the property that a potentially limitless sequence of encoding symbols may be generated from a given set of source symbols in a manner that supports ideally recovering the original source symbols from any subset of the encoding symbols having a size equal to or larger than the number of source symbols. A fountain code may be space-optimal if the original k source symbols can be recovered from any k out of n encoding symbols, k being an integer. Fountain codes may have efficient encoding and decoding algorithms that support recovering the original k source symbols from any k' of the encoding symbols with high probability, where k' is just slightly larger than k. In one embodiment, symbols are equally sized blocks or segments of information that are the smallest atomic units used by encoding or decoding operations.

An EC system may be described using an A/B notation, where B describes the total number of encoded symbols that can be produced for an input message and A describes the minimum number of the B encoded symbols that are required to reconstruct the message for which the encoded symbols where produced. By way of illustration, in a 10 of 16 configuration, or EC 10/16, sixteen encoded symbols could be produced. The 16 encoded symbols could be spread across a number of drives, nodes, or geographic locations. The 16 encoded symbols could even be spread across 16 different nodes, racks, or drives in 16 different geographic locations. In the EC 10/16 example, the original message could be reconstructed from 10 verified fragments. Conventionally, the 16 encoded symbols have been treated equally, which may have produced sub-optimal results, particularly with respect to conserving energy.

Example apparatus and methods control where erasure codes are stored based, at least in part, on a data access profile or on the likelihood that the data will be needed. Data that is most likely to be needed is stored in a more energy efficient way or more energy efficient location because it might actually be used and thus the energy needed to use it might actually be consumed. Data that is less likely to be needed is stored in a less energy efficient manner because it might never be used and thus the energy to use it might never be expended. For example, n coded symbols may have discernible access patterns. Depending on the encoding structure of an erasure code, the access patterns to the n coded symbols may demonstrate different trends in response to user requests. Some of the n coded symbols may be accessed more frequently than others depending on the mode of operation. For example, data read/write operations may result in different access patterns than repair or background operations. Putting data that is going to be used in an energy efficient location (e.g. low energy consumption L1 cache) while putting data that is not going to be used in a less energy efficient location (e.g. higher energy consumption L3 cache) improves the overall energy efficiency of a data storage system. Considering that data storage systems may include thousands of SSDs or may access data stored in a cache thousands of times a second, the improvements in energy efficiency may be substantial. Data access profiles may change after erasure coding operations are performed on data. For example, eviction and flushing operations may change a data access profile. Example methods and apparatus therefore consider data access profiles that may change, based on eviction and flushing decisions associated with data and parity data, when characterizing energy zones of an SSD or other data storage device.

Example methods and apparatus may control where erasure codes or parity data are stored based on an energy rating associated with the erasure codes. The energy rating may be used to generate a priority ranking. In one embodiment, a priority ranking for data associated with a systematic EC is higher than a priority ranking for data associated with a non-systematic EC. In one embodiment, a priority ranking for data associated with a non-systematic EC varies inversely with the number of erasures for which the non-systematic EC corrects. Thus, a non-systematic EC that corrects for a single erasure may have a higher priority than a non-systematic EC that corrects for two erasures. A priority ranking may also quantify the access frequency of the original data or the parity data block. In another embodiment, a priority ranking may be based, at least in part, on an internal structure of an erasure code or an internal structure of a data allocation approach. Thus, the energy rating of a data block or parity block may be used to determine the priority ranking of the data block or parity block.

In one embodiment, data may be stored in a location based on the decoding complexity and speed of an erasure coding approach where there are more than one parity symbols. For example, the first parity symbol of a 12/4 policy may result in faster decoding of the data when there is only one error, where a single error case is more likely than multiple error cases. Example methods and apparatus may store the first parity symbol in the same location or zone as the associated data, while storing remaining parity symbols or duplicate data in different energy zones or locations. Thus, a single error case will be more quickly decoded based on the optimized storage location of the parity symbol.

An energy rating or priority ranking may change over time. In one embodiment, the energy ranking or priorities may change in response to a user configuration. In another embodiment, the energy ranking or priorities may self-adapt over time. The priorities may self-adapt based, at least in part, on performance data associated with a DSD. The performance data may describe a number of errors experienced by the DSD, a type of error experienced by the DSD, a frequency of errors experienced by the DSD, a cost of power used by the DSD, a cost of network bandwidth used by the DSD, or other information. The energy ranking may change in response to changing data access patterns, age of data, or frequency of use.

Unlike conventional systems that store all ECs without regard to priorities, a storage location may be selected based, at least in part, on a priority. The priority may be relative. A first data block in a set of data may have a priority relatively higher than another different data block in the set of data. In one embodiment, a priority is a function of one or more factors. The factors may include, for example, a cost to store a data block or parity block on a DSD, a time to store a data block or parity block on a DSD, a number of I/O operations required for an action, an amount of energy required to store a data block or parity block on a DSD, or a network bandwidth required to store or repair a data block or parity block on a DSD. The factors may also include an energy rating or data hotness rating for the data block or parity block. Considering the time required to store a data block or parity block may improve the computing efficiency of the DSD. Considering the amount of energy required to store a data block or parity block may improve the energy efficiency of the DSD. Considering the bandwidth required to store or repair a data block or parity block may reduce the network or data communication resources for the DSD. Considering the energy rating or the data hotness rating for the data block or parity block may optimize the choice of storage location for the data block or parity block, thereby improving the energy efficiency of the DSD.

Consider a situation where the DSD includes different storage zones that have different energy efficiency properties. A DSD may include different SSDs that have different energy efficiency properties. A first SSD may be a Flash SSD that has higher power consumption, while a second, different SSD may be a DRAM SSD that has lower power consumption. Thus, example methods and apparatus may control the DSD to position data or parity data on an SSD based on a likelihood that the data will be used and the energy efficiency of the SSD. Data that is more likely to be used will be placed in a higher energy efficiency SSD that uses less electricity, while data that is less likely to be used will be placed in a lower energy efficiency SSD that uses more electricity.

Consider another situation in which the DSD includes different types of RAM. A type of RAM may have a capacity property, a power consumption property, a reliability property, a speed property, or an affordability property. Different types of RAM may have different values for their capacity property, power consumption property, reliability property, speed property, or affordability property. For example, static RAM (SRAM) may consume less power than DRAM, but SRAM may have a lower capacity. In another example, persistent, resistance-based, non-volatile cross point structure memory, including 3D Xpoint memory, may be employed to store data blocks and a single parity block, while remaining associated parity blocks may be stored in an SSD or on an HDD. Example methods and apparatus may control a DSD or computer to store data and parity data in RAM based on a property of the RAM, and a property of the data or parity data.

Therefore, example apparatus and methods improve on conventional data storage approaches by reducing the power consumed by a data storage system while offering improved speed, erasure coding, and repair capabilities.

Example methods and apparatus determine a storage location in an SSD, in persistent, resistance-based, non-volatile cross point structure memory, or in RAM for a data block or an EC or parity block based on a property of the data block, a property of the EC or parity block, and a property of the storage location. Example methods and apparatus compute an energy rating r for a parity block. The energy rating r may also be described as a data hotness rating. Thus, the property of the EC or parity block may be an energy rating r. The property of the storage location may be a capacity property, a power consumption property, a speed property, a reliability property, or an affordability property.

Consider a first set of data blocks $\{A, B, C, D, E, F, G\}$. Example apparatus and methods are configured to efficiently handle a situation in which one of the members of the first set of data blocks becomes unavailable. To handle reconstructing missing data, an erasure code approach (e.g., Fountain code) may be applied to the first set of data blocks. The erasure code approach may generate a set of 3 parity blocks $\{P_1, P_2, P_3\}$. A parity block may have an associated adjacency set that represents the data blocks that may be regenerated from the parity block. In this example, parity block $P_1$ may be used to regenerate data blocks $\{A, C, E, G\}$. Parity block $P_2$ may be used to regenerate data blocks $\{B, D\}$. Parity block $P_3$ may be used to regenerate data blocks $\{E, F, G\}$.

In this example, if data block A is not available, data block A may be regenerated from parity block $P_1$, since parity block $P_1$ has the adjacency set $\{A, C, E, G\}$. Regeneration of a data block from a parity block may be defined, in the case of data block A, as $A=(P_1-cC-eE-gG)/a$. The regeneration of other data blocks from a parity block may be similarly defined, depending on the particular adjacency set for the parity block. If data block E is not available, data block E may be regenerated from parity block $P_1$, (adjacency set $\{A, C, E, G\}$) or parity block $P_3$ (adjacency set $\{E, F, G\}$). In this example, data block E may be regenerated from parity block $P_3$ at a lower computational expense than if it was regenerated from parity block $P_1$ because the adjacency set associated with parity block $P_3$ has a length of three, while the adjacency set associated with parity block $P_1$ has a length of four. Since data block E may be regenerated from two different parity blocks, data block E has a degree of two, while data block A, which may be regenerated from just one parity block, has a degree of one. To improve computational or energy efficiency, example methods and apparatus compute a parity block access priority and choose the most efficient parity block based, at least in part, on the priority. While parity block $P_3$ may be the optimum choice for reconstruction of data blocks E or G, instead of parity block $P_1$, parity block $P_1$ may be the optimum choice to reconstruct data blocks A or C. Example methods and apparatus may first choose parity block $P_3$ to regenerate data block E or data block G, rather than parity block $P_1$.

Parity block access priority may be represented as a set of coefficients that when added together result in a sum of 1. In this example, parity block $P_1$ has a coefficient of $$2 \Big/ \binom{7}{1}.$$

Parity block $P_2$ also has a coefficient of $$2 \Big/ \binom{7}{1}.$$

Parity block $P_3$ has a coefficient of $$x \Big/ \binom{n}{k},$$

The coefficient may be generally defined as $$3 \Big/ \binom{7}{1}.$$

where the number of blocks for which a parity block is the optimum choice is x, where the number of data blocks is n, and the number of failures is k, where x, n, and k are integers. The notation $$\binom{n}{k}$$

refers to the standard mathematical operation "n choose k".

Example methods and apparatus are configured to efficiently handle situations where more than one data block is unavailable. For example, more than one data block in the first set of data blocks $\{A, B, C, D, E, F, G\}$ may become unavailable. If data blocks A and B become unavailable through DSD failure, transmission failure, or other causes, data blocks A and B may be regenerated using the combination of parity blocks $P_1$ and $P_2$. If data blocks D and E become unavailable, data blocks D and E may be regenerated using the combination of parity blocks $P_2$ and $P_3$, or parity blocks $P_2$ and $P_1$. Other combinations of data blocks may fail, and other combinations of parity blocks may be used to recover the other combinations of failed data blocks. Depending on the erasure code approach used, and depending on the contents of the adjacency sets of the parity blocks, different combinations of parity blocks may be employed to regenerate different combinations of data blocks. However, the different combinations of parity blocks may have different computational or energy requirements.

Some combinations of failed data blocks may be recoverable by two combinations of parity blocks, or by one combination of parity blocks. Other combinations of failed data blocks may not be recoverable at all. As with the single data block failure case described above, the block access priority in dual data block failure cases may be represented by a coefficient. In this double failure example, all the two-error combinations of data blocks, excluding the unrecoverable cases, may be associated with coefficients. Parity block $P_1$ has a two failure coefficient of $$12/2\left(\binom{7}{2}-3\right),$$

parity block $P_2$ has a two failure coefficient of $$10/2\left(\binom{7}{2}-3\right),$$

and parity block $P_3$ has a two failure coefficient of $$14/2\left(\binom{7}{2}-3\right).$$

Example methods and apparatus compute a hotness or energy rating r for a parity block using the coefficients described above. In this example, the hotness or energy rating r is computed using both the single failure and dual failure cases. In other embodiments, different numbers of failure cases may be computed. In one embodiment, example methods and apparatus employ a weighted sum approach to compute the hotness or energy rating. In this example, parity block $P_1$ has a rating r defined by $$P_1 = w_1 \times \frac{2}{7} + w_2 \times \frac{12}{36}.$$

Similarly, parity blocks $P_2$ and $P_3$ have ratings defined by $$P_2 = w_1 \times \frac{2}{7} + w_2 \times \frac{10}{36}, \text{ and } P_3 = w_1 \times \frac{3}{7} + w_2 \times \frac{14}{36}.$$

In this embodiment, the weights ($w_1$, $w_2$) are subject to design choices, and are a function of data loss probabilities, where $w_1+w_2=1$. Thus, the sum of the ratings for the parity blocks in a set of parity blocks will be one. In this example, the optimal parity block access priority order for the parity blocks, based on their energy ratings, is, therefore, $P_3$, $P_1$, and $P_2$.

Example methods and apparatus further adjust or compute relative ratings of data blocks and parity blocks with respect to each other. In one example, the first set of data blocks {A, B, C, D, E, F, G} is accessed every time data is requested. However, the parity blocks are only accessed when there is a failure or error occurrence among the first set of data blocks. Example methods and apparatus compute relative ratings of data blocks and parity blocks based on a probabilistic argument. For example, if there are no errors or failures at a given time with a probability $p_c$, then the data blocks may have a rating defined as $r_i \times p_c$ and parity blocks may have a rating defined as $r_i \times 1-p_c$. Thus, for the example described above in which the number of data blocks is seven and the number of parity blocks is three, the total rating for the first set of data blocks and the associated set of parity blocks or erasure code blocks, based on a hotness rating derived from single failure coefficients and dual failure coefficients, may be defined as:

$$\text{Total rating} = \Sigma_{i=1}^{7} p_c r_i + \Sigma_{i=8}^{10}(1-p_c)r_i.$$

The total rating may be generalized to the following form:

$$\text{Total rating} = \sum_{i=1}^{d} p_c r_i + \sum_{i=d+1}^{y} (1 - p_c)r_i$$

where d is the number of data blocks, and y is the number of data blocks plus parity blocks, d and y being integers.

Thus, in an embodiment where an SSD has a low energy zone with a capacity of two parity blocks, and a high energy zone with a capacity of a single parity block, parity blocks $P_3$ and $P_1$ are assigned to the low energy zone, while parity block $P_2$ is assigned to the high energy zone. In an embodiment in which an SSD has a low energy zone, a medium energy zone, and a high energy zone, where each zone has a capacity of one parity block, parity block $P_3$ is assigned to the low energy zone, parity block $P_1$ is assigned to the medium energy zone, and parity block $P_2$ is assigned to the high energy zone.

Example methods and apparatus further base the storage of data blocks on usage properties of the data blocks. For example, a change in data access frequency may change the relative energy rating of data blocks. A first data block may be accessed hourly and have a relative access rating $c_1$. A second data block may be accessed daily and have a relative access rating $c_2$. A third data block may be accessed weekly and have a relative access rating $c_3$. Thus, a j-th block of data i will have a rating $f(c_i, r_j)$ where f is a function of the ratings $c_i$ and $r_j$. In one embodiment, $f(c_i,r_j)=c_i \cdot r_j$. In other embodiments, other functions may be employed. Example methods and apparatus compare the rating $f(c_i, r_j)$ for a block according to boundary energy ratings for different zones in a DSD (e.g., low energy zone, high energy zone) and select the zone in which to store the block based, at least in part, on the rating and the energy rating of the zone. In one embodiment, if a zone is full, example methods and apparatus select the next least costly zone. In one embodiment, energy zone information, including capacity, may be stored in a data structure, including a look-up table. In another embodiment, energy zone information, including capacity, may be computed for incoming data.

The rating $f(c_i, r_j)$ may change over time. For example, a relative access rating $c_i$ may change over time. The failure probability $p_c$ may change over time due to changes to properties of the DSD, or for other reasons. The rating r of a data block or parity block may also change over time. Thus, a parity block that is initially assigned to a high energy zone may, over time, be re-assigned to a lower energy zone. For example, data migration may not be initiated immediately upon the occurrence of an event. Example methods and apparatus may wait for a threshold period of time after the occurrence of an event to make a decision about migrating data. The threshold period of time may be a function of access frequencies required to reach a stable state, and other latencies in the DSD. Delaying data migration decisions for a threshold period of time improves on conventional approaches by reducing wear and tear on the DSD hardware.

The detailed descriptions that follow are presented in terms of algorithms and symbolic representations of operations on data bits within a memory. These algorithmic descriptions and representations are used by those skilled in the art to convey the substance of their work to others. An algorithm, here and generally, is conceived to be a sequence of operations that produce a result. The operations may include physical manipulations of physical quantities. Usually, though not necessarily, the physical quantities take the form of electrical or magnetic signals capable of being stored, transferred, combined, compared, and otherwise manipulated in a circuit, and so on. The physical manipulations create a concrete, tangible, useful, real-world result.

It has proven convenient at times, principally for reasons of common usage, to refer to these signals as bits, values, elements, symbols, characters, terms, numbers, and so on. It should be borne in mind, however, that these and similar terms are to be associated with the appropriate physical quantities and are merely convenient labels applied to these quantities. Unless specifically stated otherwise, it is appreciated that throughout the description, terms including processing, computing, calculating, determining, and so on, refer to actions and processes of a computer system, circuit, processor, or similar electronic device that manipulates and transforms data represented as physical (electronic) quantities.

FIG. 1 illustrates an example method 100 for storing electronic data in an energy efficient manner. Method 100 includes, at 110, accessing a set of data blocks. The data blocks may be a file, a data object, or a portion of a file. The set of data blocks may be accessed from a computer memory or from a DSD, including an SSD. The set of data blocks may be accessed across a network.

Method 100 also includes, at 120, computing a first energy rating for a member of the set of data blocks. Computing the first energy rating for the member of the set of data blocks includes assigning an energy rating to the member of the set of data blocks. The energy rating may be based on a block loss probability profile associated with the set of data blocks. Computing the first energy rating for the member of the set of data blocks may also include assigning an energy rating to the member of the set of data blocks based on a set of data access patterns associated with the set of data blocks, or an access frequency associated with the member of the set of data blocks. In one embodiment, computing the first energy rating for the member of the set of data blocks includes assigning an energy rating to the member of the set of data blocks based on a block loss probability profile associated with the set of data blocks, a set of data access patterns associated with the set of data blocks, and an access frequency associated with the member of the set of data blocks. In one embodiment, the block loss probability profile may be stored in a computer memory as an array, the access frequency may be stored as a real number, and the set of data access patterns may be stored as an array.

Method 100 also includes, at 130, accessing a set of parity blocks generated from the set of data blocks. The set of parity blocks may be accessed from a computer memory or from a DSD, including an SSD. The set of parity blocks may be accessed across a network. In one embodiment, the set of parity blocks is generated from the set of data blocks using a systematic erasure code, a non-systematic erasure code, a Fountain code, a Reed-Solomon (RS) code, or a rate-compatible rateless code. In one embodiment, generic rateless codes or rate-compatible erasure codes, including rate compatible-low density parity check (RC-LDPC) codes or rate compatible (RC) turbo codes may be employed. In another embodiment, the set of parity blocks may be generated using other, different erasure code approaches. A member of the set of parity blocks includes an adjacency set. An adjacency set represents members of the set of data blocks that may be regenerated from the member of the set of parity blocks. In one embodiment, the adjacent set may be implemented as a data structure, including a list, an array, or other data structure.

Method 100 also includes, at 140, computing a second energy rating for a member of the set of parity blocks. The second energy rating for the member of the set of parity blocks is based, at least in part, on a parity block access priority coefficient. The second energy rating for the member of the set of parity blocks is inversely related to the size of the adjacency set associated with the member of the set of parity blocks.

In one embodiment, the parity block access priority coefficient is defined by $$x \Big/ \binom{n}{k}.$$

The number of data blocks in the set of data blocks for which the member of the set of parity blocks is an optimal choice from which to regenerate a data block is represented by x. In one embodiment, an optimal choice from which to regenerate a data block is a choice that requires less computational complexity than a less optimal choice. The length of the set of data blocks is represented by n. The number of failed data blocks in the set of data blocks is represented by k. In this embodiment, x, n, and k are integers greater than zero.

In one embodiment, the second energy rating for the member of the set of parity blocks is computed using a weighted sum of parity block access coefficients. A first weight $w_1$ and a second weight $w_2$ are a function of a data loss probability associated with a member of the adjacency set associated with the member of the set of parity blocks. In this embodiment, the sum of the first weight $w_1$ and the second weight $w_2$ equal 1. The first weight $w_1$, and the second weight $w_2$ may be user-adjustable, or may be automatically dynamically adjusted.

Method 100 also includes, at 150, computing a relative rating for a member of the set of data blocks or a member of the set of parity blocks as a function of the first energy rating and the second energy rating. In one embodiment, the relative rating of a member of the set of data blocks and a member of the set of parity blocks is defined by $$\Sigma_{i=1}^{d} p_c r_i + \Sigma_{i=d+1}^{y} (1-p_c) r_i.$$

In this embodiment, d represents the number of data blocks in the set of data blocks. The number d of data blocks in the set of data blocks plus the number of parity blocks in the set of parity blocks is represented by y. Thus, in an example embodiment in which three parity blocks are generated from a set of seven data blocks, d=7, and y=10. The probability that there are no data block failures among the set of data blocks within a threshold period of time is represented by $p_c$. A first energy rating for a member of the set of data blocks or a second energy rating for a member of the set of parity blocks is represented by $r_i$. In this embodiment, d and y are integers.

In one embodiment, a member of the set of data blocks or a member of the set of parity blocks has a relative access rating. The relative access rating indicates the relative access frequency of a member of the set of data blocks relative to at least one other member of the set of data blocks. The relative access rating may also indicate the relative access frequency of a member of the set of parity blocks relative to at least one other member of the set of parity blocks.

Method 100 also includes, at 160, determining an efficiency rating for a storage location in a DSD. In one embodiment, the efficiency rating is a function of a property of the DSD. The DSD may include a solid state device (SSD), a dynamic random access memory (DRAM), a static RAM (SRAM), a persistent, resistance-based, non-volatile cross point structure memory, a level 1 (L1) random access memory (RAM) cache, a level 2 (L2) RAM cache, or a level 3 (L3) RAM cache.

In one embodiment, the property of the DSD is a capacity property, a power consumption property, a write speed property, a read speed property, a reliability property, or an affordability property. In another embodiment, the property of the DSD is based on a power consumption property of the DSD, a capacity property of the DSD, a speed property of the DSD, and an affordability property of the DSD. In another embodiment, the property of the DSD may be another, different property. The property of the DSD may change over a threshold period of time, or may be user adjustable.

Method 100 also includes, at 170, selecting a storage location in the DSD as a function of the relative rating and the efficiency rating. Selecting a storage location in the DSD includes determining a final rating for the member of the set of data blocks or the member of the set of parity blocks. The final rating may be determined as a function of the relative access rating and the relative rating. Selecting a storage location also includes selecting, as a function of the final rating and the efficiency rating, a location in the DSD.

In one embodiment, the final rating is defined by the function:

$$f(c_i, r_j) = c_i \cdot r_j.$$

The relative access rating of the member of the set of data blocks or the member of the set of parity blocks is represented by $c_i$. The relative rating of the member of the set of data blocks or the relative rating of the member of the set of parity blocks is represented by $r_j$. In another embodiment, the final rating may be defined by a different function of $c_i$ and $r_j$.

In one embodiment, the final rating is user adjustable. In another embodiment, method 100 also includes automatically dynamically adjusting the final rating. The final rating may be automatically dynamically adjusted based, at least in part, on a change in the relative access rating. The final rating may also be automatically dynamically adjusted based on a change in the probability $p_c$ that there are no data block failures among the set of data blocks within the threshold period of time. In one embodiment, upon adjustment of the final rating, method 100 may automatically locate a corresponding set of data blocks or parity blocks and replace them in the DSD. Method 100 may automatically locate and replace the member of the set of data blocks or the member of the set of parity blocks in the background without interruption.

Method 100 also includes, at 180, writing the member of the set of data blocks or the member of the set of parity blocks to the storage location. Data blocks or parity blocks may be written serially or in parallel to the storage location.

In one embodiment, method 100 further includes reading a member of the set of data blocks or a member of the set of parity blocks from the storage location. The member of the set of data blocks or the member of the set of parity blocks is read according to a read order that is based, at least in part, on the final rating, the first energy rating, the second energy rating, or a property of the DSD. In one example, the member of the set of data blocks or the member of the set of parity blocks is read non-sequentially. In another embodiment, the member of the set of data blocks or the member of the set of parity blocks is read sequentially. The read order may also be based on a data protection policy associated with the member of the set of data blocks or the member of the set of parity blocks, the DSD, or a user.

While FIG. 1 illustrates various actions occurring in serial, it is to be appreciated that various actions illustrated in FIG. 1 could occur substantially in parallel. By way of illustration, a first process could access a set of data blocks, a second process could compute a relative rating for a member of the set of data blocks, and a third process select a storage location in the DSD. While three processes are described, it is to be appreciated that a greater or lesser number of processes could be employed and that lightweight processes, regular processes, threads, and other approaches could be employed.

Example methods may be better appreciated with reference to flow diagrams. While for purposes of simplicity of explanation, the illustrated methodologies are shown and described as a series of blocks, it is to be appreciated that the methodologies are not limited by the order of the blocks, as some blocks can occur in different orders and/or concurrently with other blocks from that shown and described. Moreover, less than all the illustrated blocks may be required to implement an example methodology. Blocks may be combined or separated into multiple components. Furthermore, additional and/or alternative methodologies can employ additional, not illustrated blocks.

Figure 2:
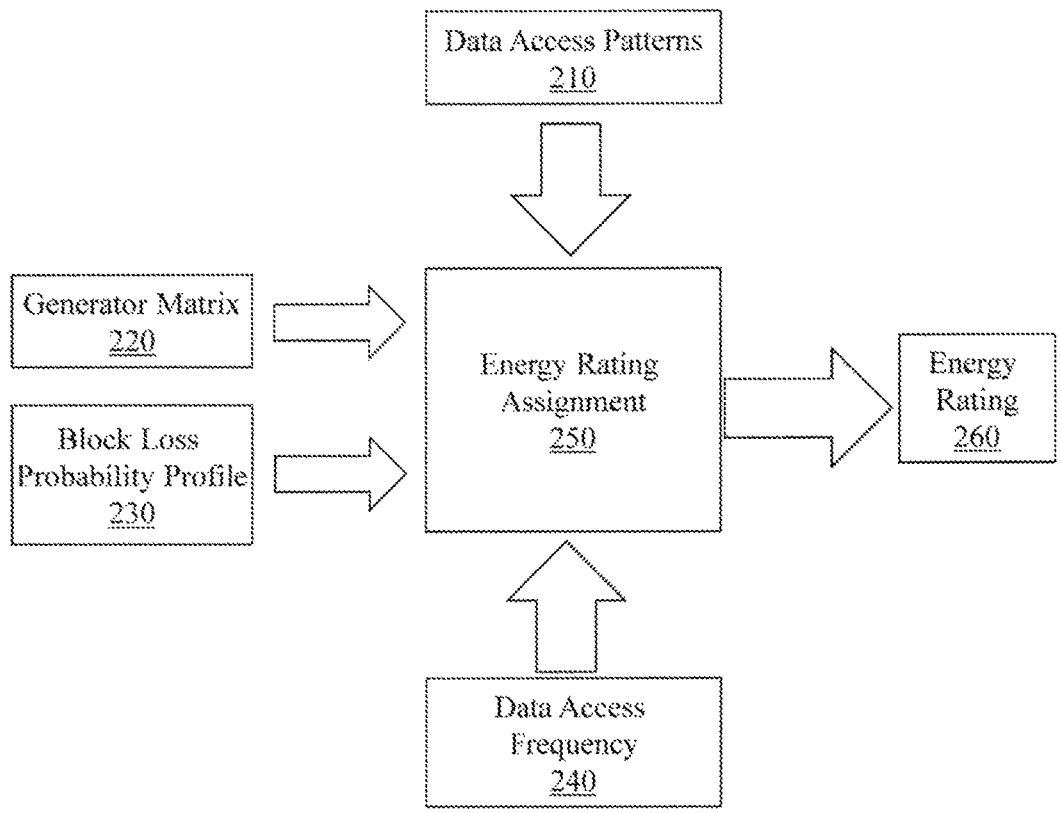
FIG. 2 illustrates an example workflow diagram of the computation of an energy rating.

FIG. 2 is a workflow diagram that illustrates one way in which example methods and apparatus may compute an energy rating. In one embodiment, data access patterns 210, generator matrix 220, block loss probability profile 230, and data access frequency 240 are used as inputs to generate an energy rating assignment 250. An energy rating 260 is then computed based, at least in part, on the energy rating assignment 250. In one embodiment, method 100 may compute the energy rating assignment 250 based on data access patterns 210, generator matrix 220, block loss probability profile 230, and data access frequency 240. Method 100 may then compute the energy rating 260 using the energy rating assignment 250. Data access patterns 210 may be stored as an array, or as another data structure. Block loss probability profile 230 may store block loss probability data in an array, or in another data structure.

Figure 3:
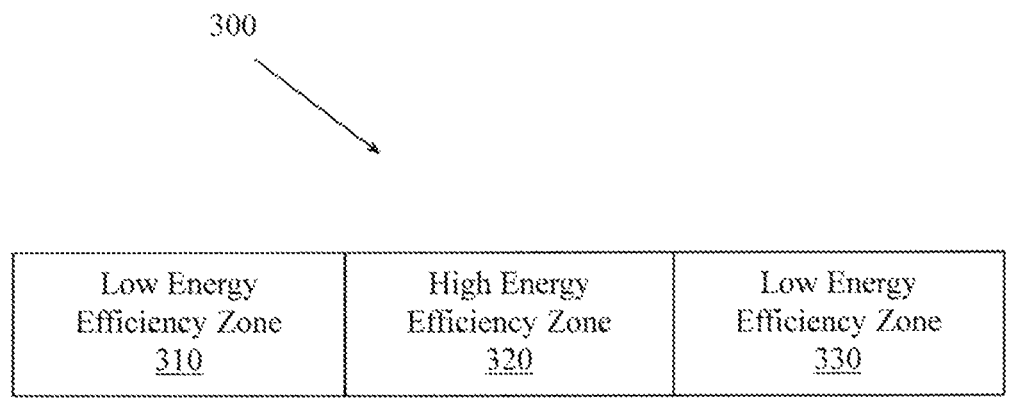
FIG. 3 illustrates a section of an SSD having different energy efficiency zones.

FIG. 3 illustrates an example DSD 300 that has different energy zones that may be employed by example methods and apparatus. DSD 300 includes a first low energy efficiency zone 310, a high energy efficiency zone 320, and a second low energy efficiency zone 330. In other embodiments, a DSD may include other numbers or other types of energy zones.

Figure 4:
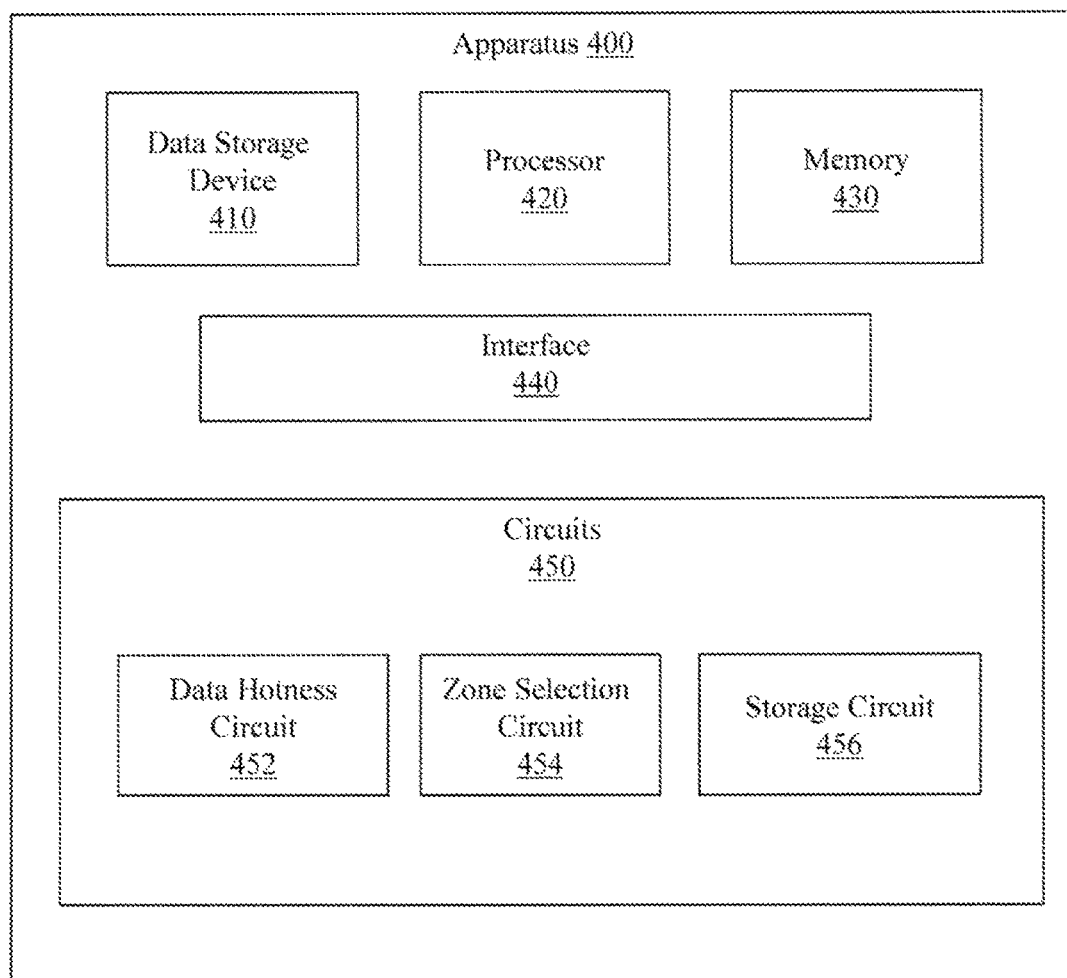
FIG. 4 illustrates an example data storage apparatus.

FIG. 4 illustrates a data storage apparatus 400. Apparatus 400 includes a data storage device (DSD) 410, a processor 420, a memory 430, a set of circuits 450, and an interface 440 that connects the DSD 410, the processor 420, the memory 430, and the set of circuits 450. Memory 430 stores electronic data that manages parity blocks or data blocks stored in the DSD. In one embodiment, apparatus 400 may be a stand-alone device connected to a data communication network. In another embodiment, apparatus 400 may be integrated into another device, including a data deduplication system. Apparatus 400 may also be integrated into another system, including an object storage system. In one embodiment, memory 430 is a persistent, resistance-based, non-volatile cross point structure memory.

Apparatus 400 protects data stored in DSD 410 using parity blocks. DSD 410 includes at least one zone. A zone may be a track, a sector, a partition, or another division of the DSD 410 suitable for storing a data block or a parity block. A zone in the DSD 410 has an energy efficiency rating. In one embodiment, a zone that has a higher level of energy efficiency (e.g. uses less power) has a higher energy efficiency rating than a zone that has a lower level of energy efficiency (e.g. uses more power). For example, DSD 410 may include an SSD that includes different types of RAM. The SSD may have a Flash RAM zone that has a low energy efficiency rating, and a DRAM zone that has a higher energy efficiency rating. Thus, the energy efficiency rating may vary depending on the type of RAM used in a first zone by the SSD relative to the type of RAM used in a second, different zone by the SSD. The DSD 410 may include a solid state device (SSD), a random access memory (RAM), a dynamic RAM (DRAM), a static RAM (SRAM), a persistent, resistance-based, non-volatile cross point structure memory, a level 1 (L1) RAM cache, a level 2 (L2) RAM cache, or a level 3 (L3) RAM cache. The DSD 410 includes a high power zone and a low power zone. In another embodiment, the DSD 410 may be another, different type of data storage device.

A zone in DSD 410 may also have a latency rating. The latency rating represents the operational speed of DSD 410 in the zone. In one embodiment, the latency rating is based on a seek time of DSD 410 in the zone, an access time of DSD 410 in the zone, or a transfer rate of DSD 410 in the zone. The latency rating, or the performance related factors upon which the latency rating is based, may change over time. In one embodiment, the latency rating may be based on other performance related factors associated with DSD 410 in the zone.

DSD 410 stores, among other things, a set of data blocks or a set of parity blocks. The parity blocks may be generated, for example, using systematic erasure codes, non-systematic erasure codes, Reed-Solomon codes, rateless erasure codes including fountain codes, a generic rateless code, or other erasure codes. A Raptor code is an example of the fountain code family. In one embodiment, other fountain codes may be used. Fountain codes may refer to linear rateless codes that have efficient encoding and decoding operations. Other codes, such as truncated rateless codes including triangular and mojette codes may be used as linear rateless codes. A generic rateless code may include rate compatible erasure codes that can cover rate compatible versions of convolutional, Turbo, or low density parity check (LDPC) codes. Other non-linear rateless codes including spinal codes may also be employed. In another embodiment, other types of erasure codes may be used. In one embodiment, a member of the set of parity blocks may be used to regenerate a member of the set of data blocks.

While DSD 410 is illustrated inside apparatus 400, in different embodiments, DSD 410 may be a standalone apparatus or a co-operating collection of apparatus.

The set of circuits 450 includes a data hotness circuit 452, a zone selection circuit 454, and a storage circuit 456. Data hotness circuit 452 produces a data hotness rating for a member of the set of data blocks or a member of the set of parity blocks. Data hotness circuit 452 produces a data hotness rating for a member of the set of parity blocks as a function of the number of data blocks that may be regenerated from the member of the set of parity blocks. Data hotness circuit 452 produces the data hotness rating as a function of the number of failures, within a threshold period of time, of data blocks that may be regenerated from the member of the set of parity blocks, and the access frequency of a data block that may be regenerated from the member of the set of parity blocks. The function employed by data hotness circuit 452 to produce the data hotness rating includes a weighted sum. In one embodiment, data hotness circuit 452 produces a data hotness rating for the member of the set of data blocks and produces a data hotness rating for the member of the set of parity blocks.

In another embodiment, the data hotness rating may also self-adapt. The data hotness rating may self-adapt based, at least in part, on a performance data associated with DSD 410. The performance data describes performance factors associated with DSD 410. The performance data may include a number of errors experienced by DSD 410, a type of error experienced by DSD 410, a frequency of errors experienced by DSD 410, a cost of power used by DSD 410, or a cost of network bandwidth used by DSD 410. In another embodiment, other performance data may be used.

In another embodiment, the data hotness rating is additionally based on a cost to store a parity block or data block on DSD 410, a time to store a parity block or data block on DSD 410, an amount of energy used to store a parity block or data block on DSD 410, or a bandwidth required to store a parity block or data block on DSD 410. The data hotness rating may, additionally, be based on other properties associated with DSD 410.

Zone selection circuit 454 selects the zone based, at least in part, on the energy efficiency rating of the zone in the DSD 410, the data hotness rating of the member of the set of data blocks, the data hotness rating of the member of the set of parity blocks, the likelihood of use of the member of the set of data blocks, and the likelihood of use of the member of the set of parity blocks. In another embodiment, zone selection circuit 454 may select the zone based on other, different parameters.

In one embodiment, the set of circuits 450 includes a retrieval circuit. The retrieval circuit computes an order of retrieval for the data blocks or parity blocks stored in the DSD 410. The retrieval circuit computes the order of retrieval based, at least in part, on the energy efficiency rating of the zone in the DSD 410, the likelihood of use of the member of the set of data blocks, or the likelihood of use of the member of the set of parity blocks. The retrieval circuit retrieves the member of the set of data blocks or the member of the set of parity blocks from the DSD 410 based, at least in part, on the order of retrieval. In another embodiment, the retrieval circuit computes the order of retrieval based on other properties of the DSD 410 or other properties of the data block or parity block. The order of retrieval may be non-sequential or sequential.

In one embodiment, the functionality associated with the set of circuits 450 may be performed, at least in part, by hardware circuit components. The hardware circuit components may include, but are not limited to, field-programmable gate arrays (FPGAs), application specific integrated circuits (ASICs), application specific standard products (ASSPs), system on a chip systems (SOCs), graphic processing units (GPUs), or complex programmable logic devices (CPLDs). In one embodiment, individual members of the set of circuits 450 are implemented as ASICs or SOCs. In another embodiment, the set of circuits 450 may be other types of systems or circuits. Apparatus 400 may be operably connected to a smartphone, a laptop computer, a tablet computer, a desktop computer, a network communication device, or a set of data storage devices.

While FIG. 4 illustrates example apparatus 400 that includes various components connected in various ways, it is to be appreciated that other apparatus may include other components connected in other ways.

Figure 5:
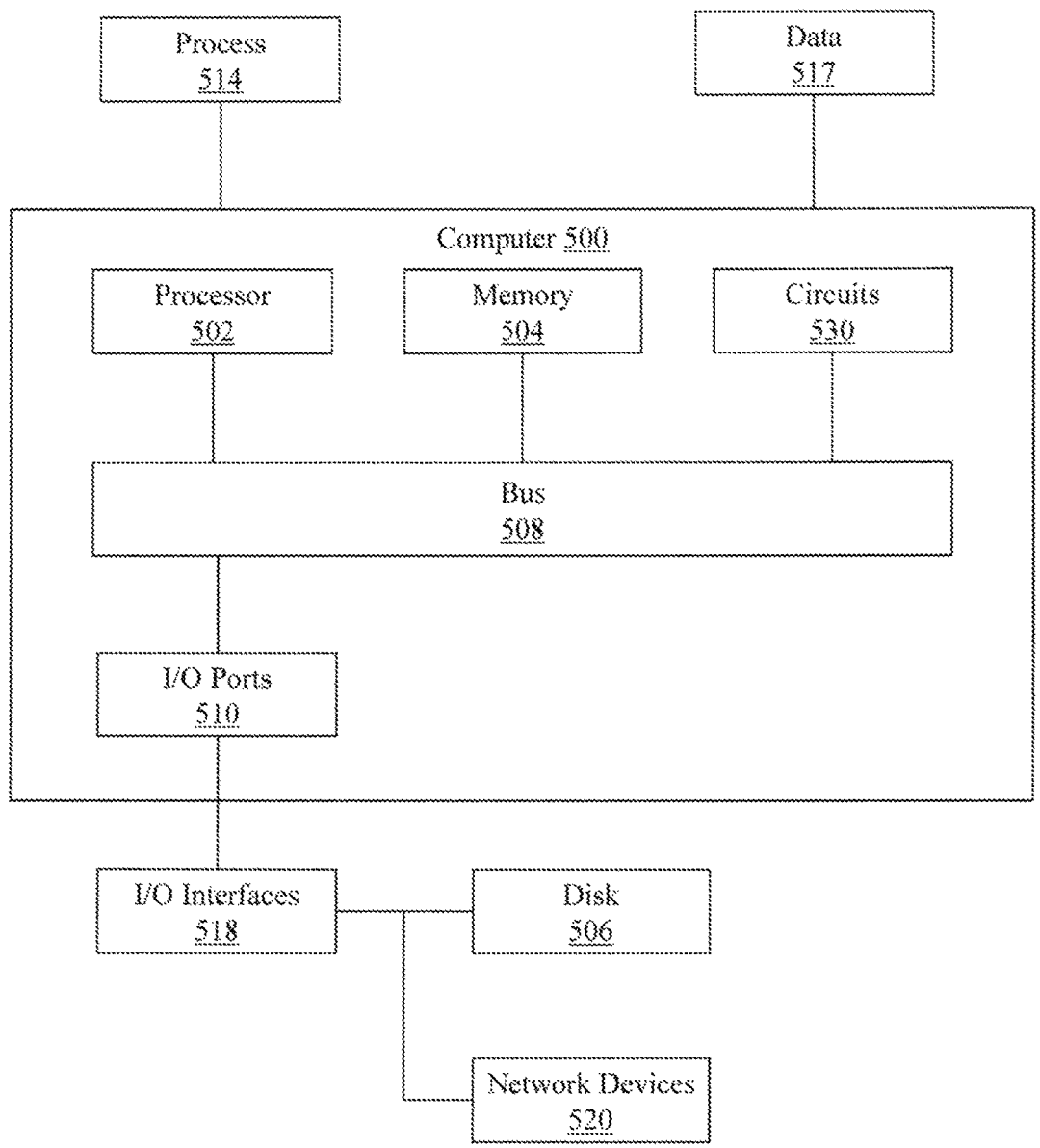
FIG. 5 illustrates an example computer in which methods and apparatus described herein may be implemented.

FIG. 5 illustrates an example computer 500 in which example methods illustrated herein can operate and in which example circuits may be implemented. In different examples, computer 500 may be part of a router, a server, a laptop computer, a tablet computer, or may be operably connectable to a data storage device.

Computer 500 includes a processor 502, a memory 504, and input/output ports 510 operably connected by a bus 508. In one example, computer 500 may include a set of circuits 530 that perform a method of storing electronic data in an energy efficient manner. Thus, the set of circuits 530, whether implemented in computer 500 as hardware, firmware, virtual circuits, and/or a combination thereof may provide means for controlling data storage devices, including SSDs, HDDs, SMR devices, or LTO tape drives to store data in an energy efficient manner. In different examples, the set of circuits 530 may be permanently and/or removably attached to computer 500. In one embodiment, the functionality associated with the set of circuits 530 may be performed, at least in part, by hardware circuit components including, but not limited to, FPGAs, ASICs, ASSPs, SOCs, or CPLDs. A virtual circuit may be implemented by computer executable instructions being executed in processor 502. In one embodiment, individual members of the set of circuits 530 are implemented as ASICs or SOCs.

Processor 502 can be a variety of various processors including dual microprocessor and other multi-processor architectures. Memory 504 can include volatile memory and/or non-volatile memory. A disk 506 may be operably connected to computer 500 via, for example, an input/output interface (e.g., card, device) 518 and an input/output port 510. Disk 506 may include, but is not limited to, devices like a magnetic disk drive, a tape drive, a Zip drive, a flash memory card, or a memory stick. Furthermore, disk 506 may include optical drives like a CD-ROM or a digital video ROM drive (DVD ROM). Memory 504 can store processes 514 or data 517, for example. Disk 506 or memory 504 can store an operating system that controls and allocates resources of computer 500.

Bus 508 can be a single internal bus interconnect architecture or other bus or mesh architectures. While a single bus is illustrated, it is to be appreciated that computer 600 may communicate with various devices, circuits, and peripherals using other busses that are not illustrated (e.g., PCIE, SATA, Infiniband, 1394, USB, Ethernet).

Computer 500 may interact with input/output devices via I/O interfaces 518 and input/output ports 510. Input/output devices can include, but are not limited to, a keyboard, a microphone, a pointing and selection device, cameras, video cards, displays, disk 506, network devices 520, or other devices. Input/output ports 510 can include but are not limited to, serial ports, parallel ports, or USB ports.

Computer 500 may operate in a network environment and thus may be connected to network devices 520 via I/O interfaces 518 or I/O ports 510. Through the network devices 520, computer 500 may interact with a network. Through the network, computer 500 may be logically connected to remote computers. The networks with which computer 500 may interact include, but are not limited to, a local area network (LAN), a wide area network (WAN), or other networks.

Figure 6:
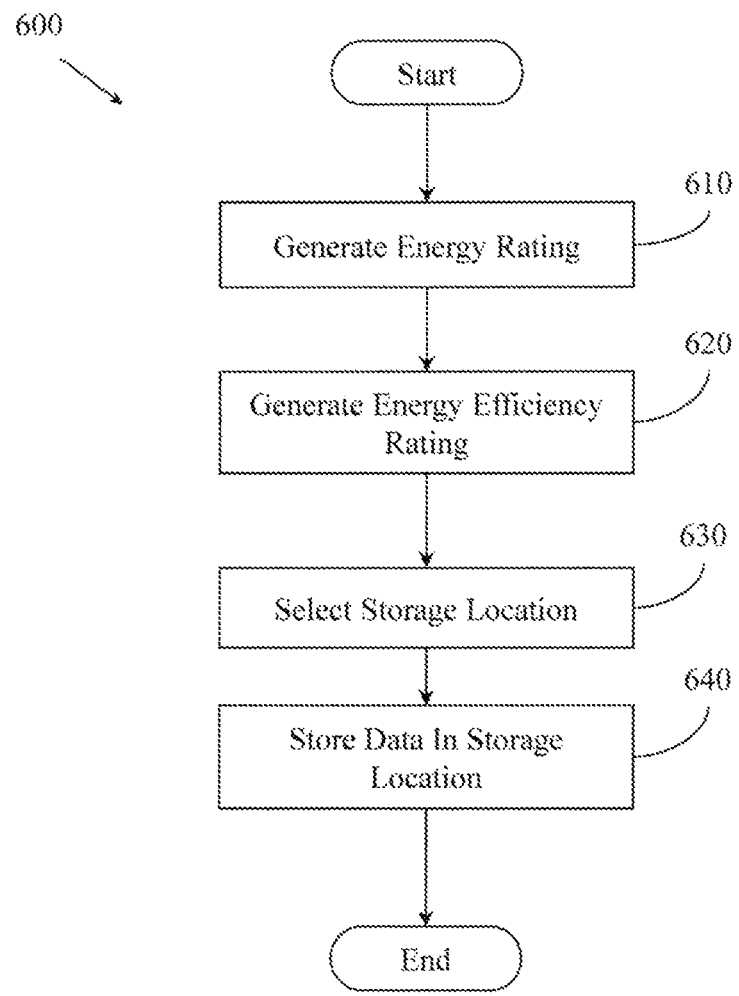
FIG. 6 illustrates an example method for storing electronic data in an energy efficient manner.

FIG. 6 illustrates an example method 600 for storing electronic data in an energy efficient manner. Method 600 includes, at 610 generating an energy rating for a data block. The data block may be a parity block generated from a data block using an erasure code. The energy rating may be based on a property of the data block. The property of the data block may be, for example, a block loss probability profile, a set of data access patterns, or an access frequency. The energy rating may be relative to an energy rating of another, different data block.

Method 600 also includes, at 620, generating an energy efficiency rating for a storage location in an SSD. The energy efficiency rating may be based on a property of a zone or location within the SSD. A property of a zone or location within the SSD may be a function of a manufacturing process used to construct the SSD. For example, non-uniform materials may be used in the manufacturing process. In another example, uniform materials may be used in conjunction with programming techniques that result in different energy zones due to inter-cell interference or other disturbances. In one embodiment, the SDD has a high energy storage location and a low energy storage location. FIG. 3 is an illustration of an example SSD 300 with a low energy efficiency zone 310 and a high energy efficiency zone 320 suitable for use by method 600.

Method 600 also includes, at 630, selecting a storage location in the SSD. Method 600 may, at 630, select the storage location as a function of the energy rating and the energy efficiency rating. For example, method 600 may generate a first energy rating for a first data block, and a second energy rating for a second data block. Method 600 may also generate a first energy efficiency rating for a first location in an SSD, and a second energy efficiency rating for a second location in the SSD. Method 600 may, at 630, select the first storage location for the first data block, based on the first energy efficiency rating and the first energy rating. For example, the combination of efficiency rating and energy rating that produce optimal energy consumption may be selected. In other embodiments, other numbers of data blocks, or numbers of locations with different energy efficiency ratings may be employed.

Method 600 also includes, at 640, storing the data block in the storage location. In one embodiment, method 600 further includes reading the data block from the storage location. Method 600 may read the data block according to a read order. The read order may be based on the energy rating and the energy efficiency rating. For example, the read order may cause items that can be read most efficiently to be read before items that are read less efficiently. Method 600 may read the data block sequentially or non-sequentially.

Figure 7:
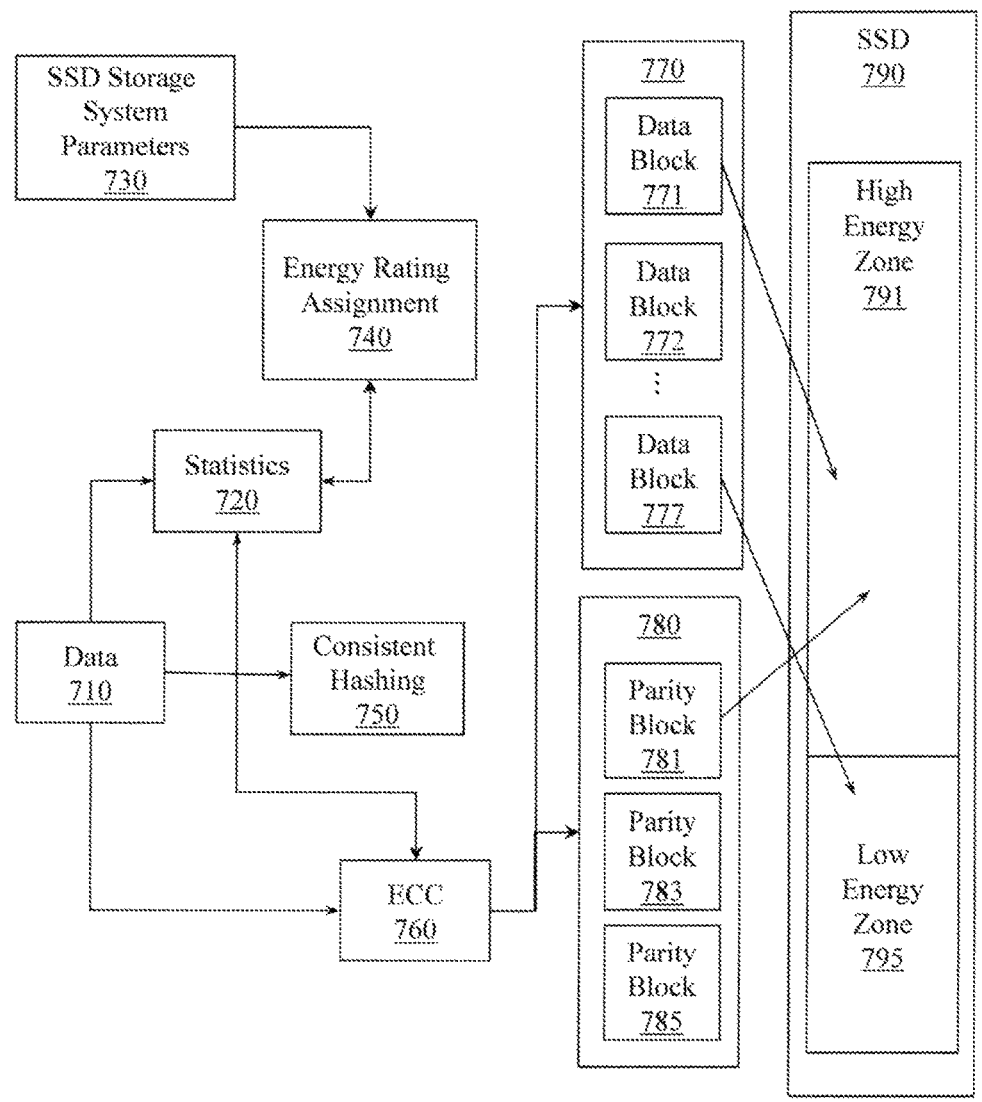
FIG. 7 illustrates an example workflow diagram of the storage of data blocks and parity blocks.

FIG. 7 illustrates an example workflow diagram of the storage of data blocks and parity blocks. FIG. 7 illustrates one possible workflow for example methods and apparatus. Statistics 720 may be gathered about electronic data 710. The statistics may be based on access frequency, error rates, age, or other properties of electronic data 710. SSD storage system parameters 730 may also be accessed. SSD storage system parameters 730 may include performance data that describes performance factors associated with an SSD 790. The performance data may include a number of errors experienced by SSD 790, a type of error experienced by SSD 790, a frequency of errors experienced by SSD 790, a cost of power used by SSD 790, or a cost of network bandwidth used by SSD 790.

Electronic data 710 may be used as an input to an error correcting code (ECC) at ECC 760. ECC 760 may use a systematic erasure code, a non-systematic erasure code, a Fountain code, an RS code, a rate-compatible LDPC code, or a rate-compatible Turbo probabilistic code to generate a set of data blocks 770 and a set of parity blocks 780. SSD storage system parameters 730, statistics 720, and electronic data 710, or the set of data blocks 770 and the set of parity blocks 780 may then be used to compute an energy rating at energy rating assignment 740. For example, data hotness circuit 452 of apparatus 400 may perform an energy rating assignment at 740.

In this example, ECC 760 generates seven data blocks and three parity blocks from data 710. The set of data blocks 770 may include data block 771, and data block 772 through data block 777. The set of parity blocks 780 may include parity block 781 and parity block 783 through parity block 785. Based on the energy rating computed at energy rating assignment 740, members of the set of data blocks 770 and members of the set of parity blocks 780 are stored in SSD 790. For example, data block 771 may be assigned a high energy rating, while data block 777 is assigned a low energy rating. In this example, data block 771 is stored in high energy zone 791, while data block 777 is stored in low energy zone 795. Parity block 781, based on the energy rating assignment, is stored in high energy zone 791. In a distributed system, data blocks and parity blocks may be distributed across multiple SSDs using consistent hashing 750. Consistent hashing 750 may pseudo-randomly distribute data blocks and parity blocks across multiple SSDs, based, at least in part, on the energy rating. Example methods and apparatus thus improve on conventional approaches to storing data blocks and parity blocks by optimally assigning data blocks and parity blocks to storage locations based on the data hotness or energy rating of the data blocks or parity blocks, and the energy efficiency of the storage locations.

References to "one embodiment", "an embodiment", "one example", and "an example" indicate that the embodiment(s) or example(s) so described may include a particular feature, structure, characteristic, property, element, or limitation, but that not every embodiment or example necessarily includes that particular feature, structure, characteristic, property, element or limitation. Furthermore, repeated use of the phrase "in one embodiment" does not necessarily refer to the same embodiment, though it may.

"Computer-readable storage device", as used herein, refers to a non-transitory medium that stores instructions or data. "Computer-readable storage device" does not refer to propagated signals. A computer-readable storage device may take forms, including, but not limited to, non-volatile media, and volatile media. Non-volatile media may include, for example, optical disks, magnetic disks, tapes, and other media. Volatile media may include, for example, semiconductor memories, dynamic memory, and other media. Common forms of a computer-readable storage device may include, but are not limited to, a floppy disk, a flexible disk, a hard disk, a magnetic tape, other magnetic medium, an application specific integrated circuit (ASIC), a compact disk (CD), other optical medium, a random access memory (RAM), a read only memory (ROM), a memory chip or card, a memory stick, and other media from which a computer, a processor or other electronic device can read.

"Circuit", as used herein, includes but is not limited to discrete hardware, (e.g., resistors, capacitors, transistors), integrated circuits, firmware, or combinations of each to perform a function(s) or an action(s), and/or to cause a function or action from another circuit, method, and/or system. A circuit may be a software controlled microprocessor, a discrete circuit (e.g., ASIC), an analog circuit, a digital circuit, a programmed logic device, a memory device containing instructions, and other entities. A circuit may include one or more gates, combinations of gates, or other circuit components. Where multiple circuits are described, it may be possible to incorporate the multiple circuits into one physical circuit. Similarly, where a single circuit is described, it may be possible to distribute that single circuit between multiple circuits.

To the extent that the term "includes" or "including" is employed in the detailed description or the claims, it is intended to be inclusive in a manner similar to the term "comprising" as that term is interpreted when employed as a transitional word in a claim.

Throughout this specification and the claims that follow, unless the context requires otherwise, the words 'comprise' and 'include' and variations such as 'comprising' and 'including' will be understood to be terms of inclusion and not exclusion. For example, when such terms are used to refer to a stated integer or group of integers, such terms do not imply the exclusion of any other integer or group of integers.

To the extent that the term "or" is employed in the detailed description or claims (e.g., A or B) it is intended to mean "A or B or both". When the applicants intend to indicate "only A or B but not both" then the term "only A or B but not both" will be employed. Thus, use of the term "or" herein is the inclusive, and not the exclusive use. See, Bryan A. Garner, A Dictionary of Modern Legal Usage 624 (2d. Ed. 1995).

While example systems, methods, and other embodiments have been illustrated by describing examples, and while the examples have been described in considerable detail, it is not the intention of the applicants to restrict or in any way limit the scope of the appended claims to such detail. It is, of course, not possible to describe every conceivable combination of components or methodologies for purposes of describing the systems, methods, and other embodiments described herein. Therefore, the invention is not limited to the specific details, the representative apparatus, and illustrative examples shown and described. Thus, this application is intended to embrace alterations, modifications, and variations that fall within the scope of the appended claims.

What is claimed is:

1. A non-transitory computer-readable storage device storing computer executable instructions that when executed by a computer control the computer to perform a method for storing data in an energy efficient manner, the method comprising:
   accessing a set of data blocks;
   computing a first energy rating for a member of the set of data blocks;
   accessing a set of parity blocks generated from the set of data blocks;
   computing a second energy rating for a member of the set of parity blocks;
   computing a relative rating for a member of the set of data blocks or a member of the set of parity blocks as a function of the first energy rating and the second energy rating;
   determining an efficiency rating for a storage location in a data storage device (DSD), where the efficiency rating is a function of a property of the DSD;
   selecting a storage location in the DSD as a function of the relative rating and the efficiency rating; and
   writing the member of the set of data blocks or the member of the set of parity blocks to the storage location.

2. The non-transitory computer-readable storage device of claim 1, where the DSD includes a solid state device (SSD), a dynamic random access memory (DRAM), a static RAM (SRAM), a persistent, resistance-based, non-volatile cross point structure memory, a level 1 (L1) random access memory (RAM) cache, a level 2 (L2) RAM cache, or a level 3 (L3) RAM cache.

3. The non-transitory computer-readable storage device of claim 1, where computing the first energy rating for the member of the set of data blocks includes assigning an energy rating to the member of the set of data blocks based on a block loss probability profile associated with the set of data blocks.

4. The non-transitory computer-readable storage device of claim 1, where computing the first energy rating for the member of the set of data blocks includes assigning an energy rating to the member of the set of data blocks based on a set of data access patterns associated with the set of data blocks.

5. The non-transitory computer-readable storage device of claim 1, where computing the first energy rating for the member of the set of data blocks includes assigning an energy rating to the member of the set of data blocks based on an access frequency associated with the member of the set of data blocks.

6. The non-transitory computer-readable storage device of claim 1, where computing the first energy rating for the member of the set of data blocks includes assigning an energy rating to the member of the set of data blocks based on a block loss probability profile associated with the set of data blocks, a set of data access patterns associated with the set of data blocks, and an access frequency associated with the member of the set of data blocks.

7. The non-transitory computer-readable storage device of claim 1, where the set of parity blocks is generated from the set of data blocks using a systematic erasure code, a non-systematic erasure code, a Fountain code, a Reed-Solomon (RS) code, a rate-compatible low-density parity check (LDPC) code, or a rate-compatible Turbo probabilistic code.

8. The non-transitory computer-readable storage device of claim 1, where the property of the DSD is a capacity property, a power consumption property, a write speed property, a read speed property, or an affordability property.

9. The non-transitory computer-readable storage device of claim 1, where the property of the DSD is based on a power consumption property of the DSD, a capacity property of the DSD, a speed property of the DSD, and an affordability property of the DSD.

10. The non-transitory computer-readable storage device of claim 1, where a member of the set of parity blocks includes an adjacency set, where the adjacency set represents members of the set of data blocks that may be regenerated from the member of the set of parity blocks.

11. The non-transitory computer-readable storage device of claim 10, where the second energy rating for the member of the set of parity blocks is based, at least in part, on a parity block access priority coefficient, and where the second energy rating for the member of the set of parity blocks is inversely related to the size of the adjacency set associated with the member of the set of parity blocks.

12. The non-transitory computer-readable storage device of claim 11, where the parity block access priority coefficient is defined by:

$$x / \binom{n}{k},$$

where the number of data blocks in the set of data blocks for which the member of the set of parity blocks is an optimum choice from which to regenerate a data block is x;

where the length of the set of data blocks is n; and where the number of failed data blocks in the set of data blocks is k, and where x, n, and k are integers.

13. The non-transitory computer-readable storage device of claim 12, where the second energy rating for the member of the set of parity blocks is computed using a weighted sum of parity block access coefficients, where a first weight $w_1$ and a second weight $w_2$ are a function of a data loss probability associated with a member of the adjacency set associated with the member of the set of parity blocks, where $w_1+w_2=1$.

14. The non-transitory computer-readable storage device of claim 13, where the relative rating of a member of the set of data blocks and a member of the set of parity blocks is defined by:

$$\sum_{i=1}^{d} p_c r_i + \sum_{i=d+1}^{y} (1-p_c) r_i$$

where d is the number of data blocks in the set of data blocks;

y is the number d of data blocks in the set of data blocks plus the number of parity blocks in the set of parity blocks;

$p_c$ is the probability that there are no data block failures among the set of data blocks within a threshold period of time; and $r_j$ is a first energy rating for a member of the set of data blocks or a second energy rating for a member of the set of parity blocks, where d and y are integers.

15. The non-transitory computer-readable storage device of claim 14, where a member of the set of data blocks or a member of the set of parity blocks has a relative access rating, where the relative access rating indicates the relative access frequency of a member of the set of data blocks relative to at least one other member of the set of data blocks, or the relative access frequency of a member of the set of parity blocks relative to at least one other member of the set of parity blocks.

16. The non-transitory computer-readable storage device of claim 15, where selecting a storage location in the DSD comprises:

determining a final rating for the member of the set of data blocks or the member of the set of parity blocks as a function of the relative access rating and the relative rating; and selecting, as a function of the final rating and the efficiency rating, a location in the DSD.

17. The non-transitory computer readable storage device of claim 16, where the final rating is defined by the function:

$$f(c_i, r_j) = c_i \cdot r_j,$$

where $c_i$ is the relative access rating of the member of the set of data blocks or the member of the set of parity blocks, and where $r_j$ is the relative rating of the member of the set of data blocks or the member of the set of parity blocks.

18. The non-transitory computer readable storage device of claim 16, where the final rating is user adjustable.

19. The non-transitory computer readable storage device of claim 16, the method comprising automatically dynamically adjusting the final rating based, at least in part, on a change in the relative access rating, or on a change in the probability $p_c$ that there are no data block failures among the set of data blocks within the threshold period of time.

20. An apparatus for storing electronic data, comprising:
a data storage device (DSD) that stores a set of data blocks or a set of parity blocks generated from the set of data blocks, where set of parity blocks is generated using an erasure code (EC), where a zone in the DSD has an energy efficiency rating;
a processor;
a memory that stores electronic data that manages parity blocks or data blocks stored in the DSD;
a set of circuits; and
an interface that connects the processor, the memory, the set of circuits, and the DSD, the set of circuits including:
a data hotness circuit that produces a data hotness rating for a member of the set of data blocks or a member of the set of parity blocks;
a zone selection circuit that selects a zone in the DSD based, at least in part, on the energy efficiency rating of the zone in the DSD, the data hotness rating of the member of the set of data blocks, the data hotness rating of the member of the set of parity blocks, a likelihood of use of the member of the set of data blocks, or a likelihood of use of the member of the set of parity blocks; and
a storage circuit that stores the member of the set of data blocks or the member of the set of parity blocks in the zone in the DSD.

21. The apparatus of claim 20, where the DSD is a solid state device (SSD), a random access memory (RAM), a dynamic RAM (DRAM), a static RAM (SRAM), a persistent, resistance-based, non-volatile cross point structure memory, a level 1 (L1) RAM cache, a level 2 (L2) RAM cache, or a level 3 (L3) RAM cache, where the DSD includes a high power zone and a low power zone.

22. The apparatus of claim 20, where the data hotness circuit produces a data hotness rating for a member of the set of parity blocks as a function of the number of data blocks that may be regenerated from the member of the set of parity blocks, the number of failures, within a threshold period of time, of data blocks that may be regenerated from the member of the set of parity blocks, and the access frequency of a data block that may be regenerated from the member of the set of parity blocks, where the function includes a weighted sum.

23. The apparatus of claim 20, where the data hotness circuit produces a data hotness rating for the member of the set of data blocks and produces a data hotness rating for the member of the set of parity blocks.

24. The apparatus of claim 20, where the zone selection circuit selects the zone based, at least in part, on the energy efficiency rating of the zone in the DSD, the data hotness rating of the member of the set of data blocks, the data hotness rating of the member of the set of parity blocks, the likelihood of use of the member of the set of data blocks, and the likelihood of use of the member of the set of parity blocks.

25. The apparatus of claim 20, the set of circuits including a retrieval circuit that computes an order of retrieval, based, at least in part, on the energy efficiency rating of the zone in the DSD, the likelihood of use of the member of the set of data blocks, or the likelihood of use of the member of the set of parity blocks, and where the retrieval circuit retrieves the member of the set of data blocks or the member of the set of parity blocks from the DSD based, at least in part, on the order of retrieval.

* * * * *